US012587203B2

(12) United States Patent
Bhat et al.

(10) Patent No.: US 12,587,203 B2
(45) Date of Patent: Mar. 24, 2026

(54) LOW DISTORTION DRIVER FOR ANALOG-TO-DIGITAL CONVERTER (ADC)

(71) Applicant: Texas Instruments Incorporated, Dallas, TX (US)

(72) Inventors: Dileep Kumar Bhat, Bangalore (IN); Rahul Sharma, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 783 days.

(21) Appl. No.: 17/853,837

(22) Filed: Jun. 29, 2022

(65) Prior Publication Data

US 2024/0007118 A1    Jan. 4, 2024

(51) Int. Cl.
| | |
|---|---|
| *H03F 3/45* | (2006.01) |
| *H03F 3/04* | (2006.01) |
| *H03G 3/30* | (2006.01) |
| *H03M 1/12* | (2006.01) |

(52) U.S. Cl.
CPC ............... *H03M 1/12* (2013.01); *H03F 3/04* (2013.01); *H03G 3/30* (2013.01)

(58) Field of Classification Search
CPC ........ H03M 1/12; H03M 1/0682; H03M 1/08; H03M 1/1245; H03F 3/04; H03F 1/3211; H03F 2203/5033; H03F 3/45179; H03F 3/505; H03G 3/30

USPC ......................................................... 330/253
See application file for complete search history.

(56) References Cited

U.S. PATENT DOCUMENTS 7,737,780 B2 *   6/2010   Singh .................. H03F 3/45677
                            330/253

* cited by examiner

*Primary Examiner* — Andrea Lindgren Baltzell
*Assistant Examiner* — Khiem D Nguyen
(74) *Attorney, Agent, or Firm* — Xianghui Huang; Frank D. Cimino

(57)          ABSTRACT

A driver includes an inverting amplifier stage and a non-inverting amplifier stage. The inverting amplifier stage includes an inverting amplifier input and an inverting amplifier output. The inverting amplifier stage includes a first voltage follower which includes a first voltage follower input coupled to the inverting amplifier input and a first voltage follower output coupled to the inverting amplifier output. The inverting amplifier stage includes a first gain-boost amplifier coupled to the first voltage follower. The non-inverting amplifier stage includes a non-inverting amplifier input and a non-inverting amplifier output. The non-inverting amplifier stage includes a second voltage follower which includes a second voltage follower input coupled to the non-inverting amplifier input and a second voltage follower output coupled to the non-inverting amplifier output. The non-inverting amplifier stage includes a second gain-boost amplifier coupled to the second voltage follower.

24 Claims, 4 Drawing Sheets

LOW DISTORTION DRIVER FOR ANALOG-TO-DIGITAL CONVERTER (ADC)

TECHNICAL FIELD

This description relates generally to drivers for analog-to-digital converters (ADCs), and more particularly to a low distortion driver for a precision ADC.

BACKGROUND

Drivers are typically used for driving analog-to-digital converters (ADCs). A driver provides an analog signal to an ADC. The ADC converts the analog signal to digital codes which represent the voltage level of the analog signal.

During a sampling phase (also known as an acquisition phase), a sampling capacitor of the ADC is coupled to the driver by typically closing switches of the ADC. As a result, the driver's output current charges or discharges the capacitor. During a conversion phase (also known a quantization phase), the sampling capacitor is disconnected from the driver by opening the switches. During the conversion phase, the ADC measures the voltage across the sampling capacitor and generates digital codes which represent the analog signal. The ADC acts as a switched capacitor load as the switches of the ADC are opened and closed to allow the driver to charge or discharge the sampling capacitor to a voltage level equal to the voltage of the analog signal. As such, the output current supplied by the driver is highly dynamic and non-linear (e.g., output current may change rapidly with respect to amplitude and polarity). This highly dynamic, non-linear output current supplied by the driver may cause distortions at the output of the driver, thus altering the shape of the analog signal.

A precision ADC generally converts an analog signal to high resolution digital information (e.g., 18-bit digital codes). Because a precision ADC typically utilizes a large sampling capacitor (e.g., between around 16 pF to around 30 pF) to reduce noise at the ADC's output, a large dynamic and non-linear current is produced as the switches of the ADC are opened and closed. The large dynamic and non-linear current causes distortions at the output of the driver, which may alter the shape of the analog signal. As such, there may be information loss between the digital information (e.g., digital codes) and the original information bearing signal.

SUMMARY

In one aspect, a driver includes a driver input and a driver output. The driver includes a voltage follower coupled to a gain-boost amplifier. The voltage follower includes a first transistor which includes a first terminal, a second terminal coupled to the driver output and a control terminal coupled to the driver input. The voltage follower includes a second transistor which includes a third terminal adapted to be coupled to a first potential, a fourth terminal coupled to the first terminal, and a control terminal. The voltage follower includes a third transistor which includes a fifth terminal coupled to the second terminal, a sixth terminal, and a control terminal adapted to be coupled to a first bias voltage source. The voltage follower includes a fourth transistor which includes a seventh terminal coupled to the sixth terminal, an eighth terminal adapted to be coupled to a common potential, and a control terminal coupled to the third terminal. The gain-boost amplifier includes a non-inverting input coupled to the first terminal, an inverting input coupled to the second terminal, and an output coupled to the control terminal of the second transistor.

In an additional aspect, the voltage follower includes a first resistor which includes a ninth terminal adapted to be coupled to the first potential and a tenth terminal coupled to the third terminal. The voltage follower includes a biasing transistor which includes an eleventh terminal coupled to the tenth terminal, a twelfth terminal coupled to the control terminal of the fourth transistor, and a control terminal adapted to be coupled to a second bias voltage source. The voltage follower includes a first bias current source adapted to be coupled between the control terminal of the fourth transistor and the common potential.

In an additional aspect, the gain-boost amplifier includes a fifth transistor which includes a fifteenth terminal, a sixteenth terminal coupled to the first terminal, and a control terminal coupled to the fifteenth terminal. The gain boost amplifier includes a sixth transistor which includes a seventeenth terminal coupled to the control terminal of the second transistor, an eighteenth terminal, and a control terminal coupled to the control terminal of the fifth transistor. The gain boost amplifier includes a seventh transistor which includes a nineteenth terminal coupled to the eighteenth terminal, a twentieth terminal coupled to the second terminal, and a control terminal coupled to the control terminals of the fifth and sixth transistors. The gain-boost amplifier includes an eighth transistor which includes a twenty-first terminal adapted to be coupled to a first potential, a twenty-second terminal coupled to the eighteenth terminal, and a control terminal adapted to be coupled to a third bias voltage source. The gain-boost amplifier includes a ninth transistor which includes a twenty-third terminal adapted to be coupled to the first potential, a twenty-fourth terminal coupled to the sixteenth terminal, and a control terminal adapted to be coupled to the third bias voltage source.

In an additional aspect, the voltage follower includes a compensation circuit coupled between the control terminal of the fourth transistor and the second terminal. The compensation circuit includes a compensation capacitor and a compensation resistor coupled in series between the control terminal of the fourth transistor and the second terminal.

In an additional aspect, a driver includes an inverting amplifier stage and a non-inverting amplifier stage. The inverting amplifier stage includes an inverting amplifier input and an inverting amplifier output. The inverting amplifier stage includes a first voltage follower which includes a first voltage follower input coupled to the inverting amplifier input and a first voltage follower output coupled to the inverting amplifier output. The inverting amplifier stage includes a first gain-boost amplifier coupled to the first voltage follower. The non-inverting amplifier stage includes a non-inverting amplifier input and a non-inverting amplifier output. The non-inverting amplifier stage includes a second voltage follower which includes a second voltage follower input coupled to the non-inverting amplifier input and a second voltage follower output coupled to the non-inverting amplifier output. The non-inverting amplifier stage includes a second gain-boost amplifier coupled to the second voltage follower.

In an additional aspect, a first compensation circuit is coupled to the first voltage follower and a second compensation circuit coupled to the second voltage follower.

In an additional aspect, a first cross-capacitor compensation circuit is coupled between the first compensation circuit and the non-inverting amplifier output, and a second cross-capacitor compensation circuit is coupled between the second compensation circuit and the inverting amplifier output.

BRIEF DESCRIPTION OF THE DRAWINGS

The same reference numerals or other feature designators are used in the drawings to designate the same or similar (functionally and/or structurally) features.

DETAILED DESCRIPTION

Figure 1:
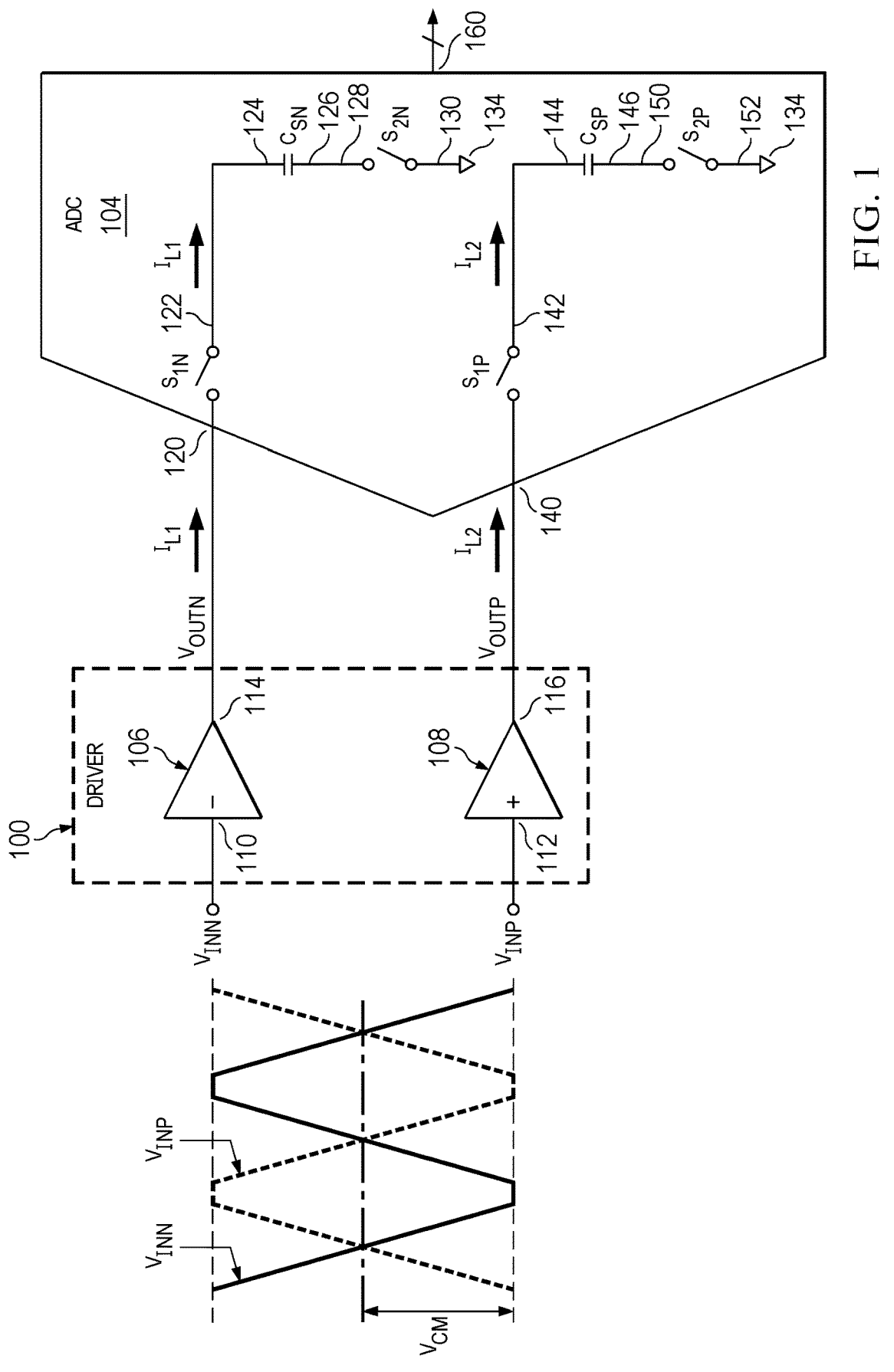
FIG. 1 illustrates a block diagram of a driver of an example embodiment which is coupled to an ADC.

FIG. 1 illustrates a block diagram of a driver 100 of an example embodiment. The driver 100 is coupled to drive an analog-to-digital converter (ADC) 104. The driver 100 can be used in various applications including, for example, in precision line drivers, instrumentation systems and high-speed ADCs. In some example embodiments, the driver 100 is configured to drive a high-speed precision ADC which converts analog signals to high resolution digital information.

The driver 100 includes an inverting amplifier stage 106 and a non-inverting amplifier stage 108. The inverting amplifier stage 106 includes an inverting input 110 and the non-inverting amplifier stage 108 includes a non-inverting input 112. The driver 100 is coupled to receive a differential signal which includes two complementary signals: a voltage $V_{INN}$ (also referred to as an inverting input signal) applied to the inverting input 110; and a voltage $V_{INP}$ (also referred to as a non-inverting input signal) applied to the non-inverting input 112. The voltages $V_{INN}$ and $V_{INP}$ are balanced because they have equal amplitude and opposite polarity relative to a common-mode voltage $V_{CM}$. The inverting amplifier stage 106 provides an output voltage $V_{OUTN}$ at an output 114, and the non-inverting amplifier stage 108 provides an output voltage $V_{OUTP}$ at an output 116.

As an example, the ADC 104 includes a first switch $S_{IN}$ which includes a first terminal 120 adapted to be coupled to receive $V_{OUTN}$ and includes a second terminal 122. The ADC 104 includes a first sampling capacitor $C_{SN}$ (e.g., around 28 pF) which includes a first terminal 124 coupled to the second terminal 122 of $S_{IN}$ and includes a second terminal 126. The ADC 104 includes a second switch $S_{2N}$ which includes a first terminal 128 coupled to the second terminal 126 of the first sampling capacitor $C_{SN}$ and includes a second terminal 130 coupled to a common potential 134 (e.g., ground).

In this example, the ADC 104 includes a third switch $S_{1P}$ which includes a first terminal 140 adapted to be coupled to receive $V_{OUTP}$ and includes a second terminal 142. The ADC 104 includes a second sampling capacitor $C_{SP}$ (e.g., around 28 pF) which includes a first terminal 144 coupled to the second terminal 142 of $S_{1P}$ and includes a second terminal 146. The ADC 104 includes a fourth switch $S_{2P}$ which includes a first terminal 150 coupled to the second terminal 146 of $S_{1P}$ and includes a second terminal 152 coupled to the common potential 134 (e.g., ground).

During a sampling phase (also known as an acquisition phase), the switches $S_{1N}$, $S_{2N}$, $S_{1P}$ and $S_{2P}$ are closed. As a result, the first sampling capacitor $C_{SN}$ is charged by $V_{OUTN}$ and the second sampling capacitor $C_{SP}$ is charged by $V_{OUTP}$. During a conversion phase (also known a quantization phase) the switches $S_{1N}$, $S_{2N}$, $S_{1P}$ and $S_{2P}$ are opened, and the ADC 104 measures the voltages across the capacitors $C_{SN}$ and $C_{SP}$ and generates digital codes at an output 160 representing the differential input voltage.

Due to the switching of $S_{1N}$, $S_{2N}$, $S_{1P}$ and $S_{2P}$, dynamic load currents $I_{L1}$ and $I_{L2}$ which charge and discharge the respective $C_{SN}$ and $C_{SP}$ may change instantaneously with respect to their amplitudes and polarities. For example, if in a previous sampling phase, $C_{SN}$ was charged to 2V but in a next sampling phase $V_{OUTN}$ is at 4V, when $S_{1N}$ and $S_{2N}$ are closed, the load current $I_{L1}$ instantaneously rises and flows into $C_{SN}$ until $C_{SN}$ is charged to 4V. Conversely, if in a previous sampling phase $C_{SN}$ is at 4V but in a next sampling phase $V_{OUTP}$ is at 2V, when $S_{1N}$ and $S_{2N}$ are closed, the load current $I_{L1}$ instantaneously falls and flows out of $C_{SN}$ until $C_{SN}$ is discharged to 2V. Thus, the load currents $I_{L1}$ and $I_{L2}$ have dynamic, non-linear characteristics and the ADC 104 acts as a non-linear load.

In some example embodiments, the ADC 104 is an 18-bit ADC which digitizes an analog signal at a rate of 20 Mbsps and generates $2^{18}$ bits digital codes which represent the analog signal. In some example embodiments, the driver 100 produces a distortion of around −120 dB at a low frequency (e.g., around 10 kHz) and around −100 dB at a high frequency (e.g., around 5 MHz). The distortion generally alters the original shape or other characteristics of the information bearing signals (e.g., $V_{INN}$ and $V_{INP}$). In some example embodiments, the driver 100 and the ADC 104 are implemented in a single integrated circuit (IC).

In some example embodiments, the driver 100 may be used for a single-ended signaling. In a single-ended signaling implementation, the driver 100 receives only a single-ended signal (e.g., $V_{INN}$ or $V_{INP}$) which is referenced to the common potential 134 (e.g., ground). The current associated with the single-ended signal (e.g., $V_{INN}$ or $V_{INP}$) may flow from a power supply (not shown in FIG. 1) into the driver 100 and return to the power supply through the common potential 134 (e.g., ground).

In a differential signaling implementation, because the voltages $V_{INN}$ and $V_{INP}$ are balanced, the return currents associated with the voltages $V_{INN}$ and $V_{INP}$ are also balanced and hence cancel each other out. Ideally, in a differential signaling implementation, zero current flows to the common potential 134 (e.g., ground). Also, in a differential signaling implementation, any electromagnetic interference (EMI) or crosstalk (e.g., EMI generated by nearby signals) is added equally to $V_{INN}$ and $V_{INP}$. Because the driver 100 responds to the difference in voltage between $V_{INN}$ and $V_{INP}$, the driver 100 reduces the amplitude of the EMI or crosstalk. Also, because of their improved resistance to noise, differential signals can use lower voltage and still maintain adequate signal-to-noise ratio (SNR). In a differential signaling, the SNR is increased by a factor of two relative to an equivalent single-ended implementation because the dynamic range of $V_{INN}$ and $V_{INP}$ at the driver 100 is twice as high as the dynamic range of an equivalent single-ended signal.

Figure 2:
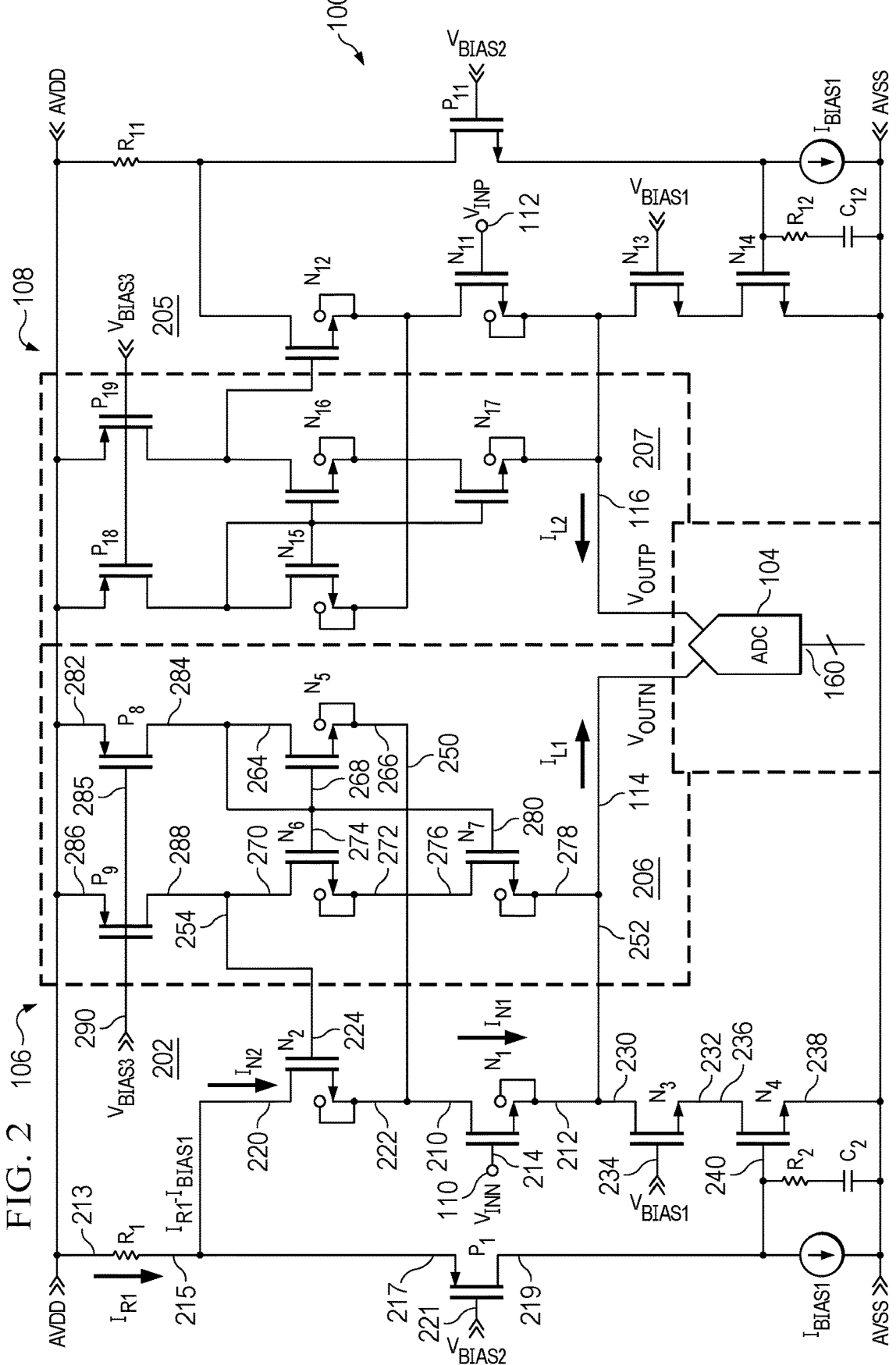
FIG. 2 illustrates a schematic diagram of a driver of an example embodiment.

FIG. 2 illustrates a schematic of the driver 100 of an example embodiment. The driver 100 includes an implementation of the inverting and non-inverting amplifier stages, 106 and 108, respectively.

The inverting amplifier stage 106 includes the inverting input 110 and the inverting output 114. The inverting amplifier stage 106 includes a voltage follower 202 which includes a first transistor $N_1$. In some example embodiments, the first transistor $N_1$ is an n-channel MOSFET (e.g., NMOS transistor). The first transistor $N_1$ includes a first terminal 210 (e.g., drain), a second terminal 212 (e.g., source), and a control terminal 214 (e.g., gate). The control terminal 214 (e.g., gate) is coupled to the inverting input 110 which is adapted to be coupled to receive the input signal $V_{INN}$. The second terminal 212 (e.g., source) is coupled to the inverting output 114.

In some example embodiments, $N_1$ acts as a source follower (e.g., voltage at the source 212 follows the voltage at the gate 214). The inverting amplifier stage 106 provides the output signal $V_{OUTN}$ at the inverting output 114. The ADC 104 can be coupled to the inverting output 114 (and also coupled to the non-inverting output 116). The ADC 104 generates digital codes at the output 160.

The voltage follower 202 includes a second transistor $N_2$ which in some example embodiments is an NMOS transistor. The second transistor $N_2$ includes a third terminal 220 (e.g., drain) adapted to be coupled to a first potential AVDD (e.g., 4.5V, 5V or 5.5V) via a resistor $R_1$, a fourth terminal 222 (e.g., source) coupled to the first terminal 210 (e.g., drain) of the first transistor $N_1$ and includes a control terminal 224 (e.g., gate).

In some example embodiments, the second transistor $N_2$ is configured to operate as a cascode transistor (e.g., biased as a common gate amplifier and also referred to as a current buffer). As a cascode transistor, $N_2$ bootstraps the transistor $N_1$ to provide a constant voltage swing across the drain 210 and the source 212 of $N_1$. As a result, an input-dependent modulation of an output conductance ($G_{DS}$) (e.g., conductance between drain and source) of $N_1$ is suppressed, which improves distortion at the output 114.

The voltage follower 202 includes a third transistor $N_3$ which includes a fifth terminal 230 (e.g., drain) coupled to the second terminal 212 (e.g., source) of $N_1$. The third transistor $N_3$ includes a sixth terminal 232 (e.g., source) and includes a control terminal 234 (e.g., gate) adapted to be coupled to a first bias voltage source $V_{BIAS1}$. In some example embodiments, $V_{BIAS1}$ may, for example, have a voltage level such that the gate-to-source voltage of $N_3$ is around 0.7V. In some example embodiments, the third transistor $N_3$ is configured to operate as a cascode transistor to provide a high output resistance looking into the drain 230 of $N_3$ and to ensure that $N_3$ operates in a saturation region (e.g., $N_3$ always conduct).

The voltage follower 202 includes a fourth transistor $N_4$ which includes a seventh terminal 236 (e.g., drain) coupled to the sixth terminal 232, an eighth terminal 238 (e.g., source) adapted to be coupled to a common potential AVSS (e.g., ground) and a control terminal 240 (e.g., gate) coupled to the third terminal 220 (e.g., drain) of $N_2$.

In some example embodiments, the third terminal 220 (e.g., drain) of $N_2$ is coupled to the first potential AVDD via the resistor $R_1$ (e.g., around 60 ohms, or around 240 ohms). The resistor $R_1$ includes a ninth terminal 213 coupled to the first potential AVDD and includes a tenth terminal 215 coupled to the third terminal 220 (e.g., drain) of $N_2$. In some example embodiments, the resistor $R_1$ is implemented with a MOSFET (not shown in FIG. 2) which is biased to operate in a saturation region. As a result, a current $I_{R1}$ (e.g., around 2 mA, 7 mA) through the resistor $R_1$ remains constant.

In some example embodiments, a biasing transistor $P_1$ includes an eleventh terminal 217 (e.g., source) coupled to the tenth terminal 215, a twelfth terminal 219 (e.g., drain) coupled to the control terminal 240 (e.g., source) of $N_4$ and includes a control terminal 221 adapted to be coupled to a second bias voltage source $V_{BIAS2}$ (e.g., 4V). In some example embodiments, the biasing transistor $P_1$ is a p-channel MOSFET (e.g., PMOS transistor) biased to operate in a saturation region. The transistor $P_1$ and the resistor $R_1$ set the current $I_{R1}$ which flows through $R_1$.

In some example embodiment, a first bias current source $I_{BIAS1}$ (e.g., supplying/sinking around 1 mA to around 3 mA) is coupled between the control terminal 240 of the fourth transistor $N_4$ and the common potential AVSS (e.g., ground). In some example embodiments, an NMOS transistor biased in a saturation region may be used to implement the current source $I_{BIAS1}$. The current source $I_{BIAS1}$ acts as a high impedance device at the gate 240 of the transistor $N_4$. A high gain negative feedback loop is formed from the control terminal 240 of the transistor $N_4$ through the transistors $N_3$, $N_1$, $N_2$ and $P_1$. Because the current $I_{BIAS1}$ is constant and $I_{R1}$ is also constant (e.g., $I_{R1}$ is set by the transistor $P_1$ and the resistor $R_1$), a current $I_{N1}$ through the transistor $N_1$ is approximately constant.

The negative feedback loop formed from the control terminal 240 of the transistor $N_4$ through the transistors $N_3$, $N_1$, $N_2$ and $P_1$ biases the control terminal 240 of $N_4$. In some example embodiments, the negative feedback loop is stabilized by a resistor $R_2$ and a capacitor $C_2$ which are coupled in series between the control terminal 240 of $N_4$ and the common potential AVSS. The transistor $N_3$ is biased to operate as a cascode transistor which increases the gain between the control terminal 240 of $N_3$ and the second terminal 212 of $N_1$, thus increasing the gain between the control terminal 240 of $N_3$ and the output 114. By biasing the control terminal 240 of $N_4$, the negative feedback loop (e.g., formed by the transistors $N_4$, $N_3$, $N_1$, $N_2$ and $P_1$) allows the driver 100 to charge and discharge the sampling capacitor $C_{SN}$ (shown in FIG. 1) of the ADC 104 through the transistor $N_4$.

For example, the capacitor $C_{SN}$ of the ADC 104 (shown in FIG. 1) may be charged to 2V during a sampling phase. Prior to the next sampling phase, due to a rise in the input $V_{INN}$, the output $V_{OUTN}$ may rise to 4V. In the next sampling phase, when the switches $S_1$ and $S_2$ of the ADC 104 (shown in FIG. 1) are closed, the output 114 is coupled to the capacitor $C_{SN}$ which results in an instantaneous charge sharing between $C_{SN}$ (shown in FIG. 1) and a parasitic capacitor (not shown in FIG. 2) which may be coupled between the second terminal 212 and the control terminal 214 or between the second terminal 212 and the common potential AVSS. Due to this charge sharing, an instantaneous drop of the voltage occurs at the second terminal 212 of $N_1$. Thus, the gate-to-source voltage of $N_1$ increases, which causes $N_1$ to draw more current. As such, the voltage at the third terminal 220 of $N_3$ drops, which causes the transistor $P_1$ to turn off (e.g., become non-conducting) or conduct a very small amount of current, thereby decreasing the gate-to-source voltage of $N_4$. As a result, the transistor $N_4$ is turned off and a current $I_{N1}$ through the transistor $N_1$ is forced to flow into the capacitor $C_{SN}$ until the capacitor is charged to 4V.

Conversely, the capacitor $C_{SN}$ of the ADC 104 (shown in FIG. 1) may be charged to 4V during a sampling phase. Prior to the next sampling phase, due to a drop in the input $V_{INN}$, the output voltage $V_{OUTN}$ may fall to 2V. In the next sampling phase, when the switches $S_1$ and $S_2$ (shown in FIG. 1) are closed, the output 114 is coupled to the capacitor $C_{SN}$ (shown in FIG. 1) which results in an instantaneous rise of the voltage at the second terminal 212 of $N_1$ due to an instantaneous charge sharing between $C_{SN}$ (shown in FIG. 1) and the parasitic capacitor (not shown in FIG. 2) at the second terminal 212. Thus, the gate-to-source voltage of $N_1$ decreases, which causes $N_1$ to draw less current. As such, the voltage at the third terminal 220 rises, which causes the transistor $P_1$ to strongly turn on. Thus, the current flowing through $P_1$ increases, thereby increasing the gate-to-source voltage of the transistor $N_4$. Thus, $N_4$ strongly turns on, which provides a path for the capacitor $C_{SN}$ to be discharged through $N_4$ until the voltage across the capacitor falls to 2V.

The inverting amplifier stage 106 includes a gain-boost amplifier 206 which includes an inverting input 250 coupled to the first terminal 210 of $N_1$, a non-inverting input 252 coupled to the second terminal 212 of $N_1$, and an output 254 coupled to the control terminal 224 of transistor $N_2$.

The gain-boost amplifier 206 senses a voltage difference between the first terminal 210 and the second terminal 212, and, in response, biases a voltage at the control terminal 224 of $N_2$. The voltage at the control terminal 224 tracks the input voltage $V_{INN}$ with an added DC offset voltage. This added DC offset voltage maintains a higher voltage at the second terminal 212 of $N_1$ and biases $N_1$ in a saturation region, which increases a drain-to-source resistance of $N_1$. In some example embodiments, the DC offset voltage (e.g., around 300 mV) is greater than the saturation voltage of $N_1$. If the input voltage $V_{INN}$ rises, the voltage at the second terminal 214 of $N_1$ also rises. Thus, the voltage at the first terminal 210 of $N_1$ also rises with the added DC offset. As a result, $N_1$ effectively remains bootstrapped (e.g., gate-to-source voltage of $N_1$ and a drain-to-source voltage of $N_1$ are held approximately constant). Thus, the drain-to-source resistance of $N_1$ is also held approximately constant (e.g., does not modulate). As a result, unwanted distortion of the output signal $V_{OUTN}$ due to any modulation of the drain-to-source resistance of $N_1$ is reduced, thereby reducing distortion. In some example embodiments, by implementing the gain-boost amplifier 206, the total harmonic distortion of the driver 100 at low frequencies (e.g., around 100 kHz or less) may be reduced to approximately –126 dB.

In some example embodiments, the gain-boost amplifier 206 includes a fifth transistor $N_5$ which includes a fifteenth terminal 264 (e.g., drain), a sixteenth terminal 266 (e.g., source) coupled to the first terminal 210, and a control terminal 268 (e.g., gate) coupled to the fifteenth terminal 264. The gain-boost amplifier 206 includes a sixth transistor $N_6$ which includes a seventeenth terminal 270 (e.g., drain) coupled to the control terminal 224 of the transistor $N_2$, an eighteenth terminal 272 (e.g., source), and a control terminal 274 (e.g., gate) coupled to the control terminal 268 of the fifth transistor $N_5$. The gain-boost amplifier 206 includes a seventh transistor $N_7$ which includes a nineteenth terminal 276 (e.g., drain) coupled to the eighteenth terminal 272, a twentieth terminal 278 (e.g., source) coupled to the second terminal 212 of $N_1$, and a control terminal 280 coupled to the control terminals 268 and 274 of the respective fifth and sixth transistors $N_5$ and $N_6$.

In some example embodiments, the fifth transistor $N_5$ is coupled to the first potential AVDD via an eighth transistor $P_8$, and the sixth transistor $N_6$ is coupled to the first potential AVDD via a ninth transistor $P_9$. The transistors, $P_8$ and $P_9$, in some example embodiments, are PMOS transistors. The transistor $P_8$ includes a source 282 adapted to be coupled to the first potential AVDD, a drain 284 coupled to the drain 264 of $N_5$ and includes a gate 285 adapted to be coupled to a third bias voltage source $V_{BIAS3}$ (e.g., around 4.2V). The transistor $P_9$ includes a source 286 adapted to be coupled to the first potential AVDD, a drain 288 coupled to the first terminal 254 (e.g., drain) of $N_6$ and includes a gate 290 adapted to be coupled to the third bias voltage $V_{BIAS3}$. The transistors $P_8$ and $P_9$ act as current sources which bias the gain-boost amplifier 206. The transistor $P_8$ controls the current flowing through $N_5$, and the transistor $P_9$ controls the current flowing through $N_6$.

The transistors $N_5$, $N_6$ and $N_7$ of the gain-boost amplifier 206 are not directly coupled to the first potential AVDD (e.g., around 5V) but are instead coupled to the first potential AVDD via the transistors $P_8$ and $P_9$. As such, voltage swings (e.g., drain-to-source voltage, gate-to-source voltage and gate-to-drain voltage) at $N_5$, $N_6$ and $N_7$ may be within 1.5V, which allows the transistors $N_5$, $N_6$ and $N_7$ to be rated at a lower voltage (e.g., 1.5V) than the supply voltage (e.g., AVDD). An advantage of using lower voltage rated transistors (e.g., $N_5$, $N_6$ and $N_7$) is that the lower voltage rated transistors are inherently faster than higher voltage rated transistors and they require less area to implement in an integrated circuit.

The non-inverting amplifier stage 108 includes the non-inverting input 112 and the non-inverting output 116. The non-inverting amplifier stage 108 includes a voltage follower 205 coupled between the first potential AVDD and the common potential AVSS. The non-inverting amplifier stage 108 includes a gain-boost amplifier 207 coupled to the voltage follower 205. The voltage follower 205 includes transistors $N_{11}$, $N_{12}$, $N_{13}$, $N_{14}$ and $P_{11}$ and includes resistors $R_{11}$, $R_{12}$ and a capacitor $C_{12}$. The gain-boost amplifier 207 includes transistors $N_{15}$, $N_{16}$, $N_{17}$, $P_{18}$ and $P_{19}$. The non-inverting amplifier stage 108 is constructed in a similar way as the inverting amplifier stage 106. The description related to the configuration and operation of the inverting stage 106 is also applicable to the non-inverting stage 108. In response to the input signal $V_{INP}$, the non-inverting amplifier stage 108 provides the non-inverting output $V_{OUTP}$ at the output 116.

In some example embodiments, body terminals (e.g., back gate connections) of the transistors $N_1$, $N_2$, $N_5$, $N_6$, $N_7$, $N_{11}$, $N_{12}$, $N_{15}$, $N_{16}$ and $N_{17}$ are coupled to the source of the respective transistors.

Figure 3:
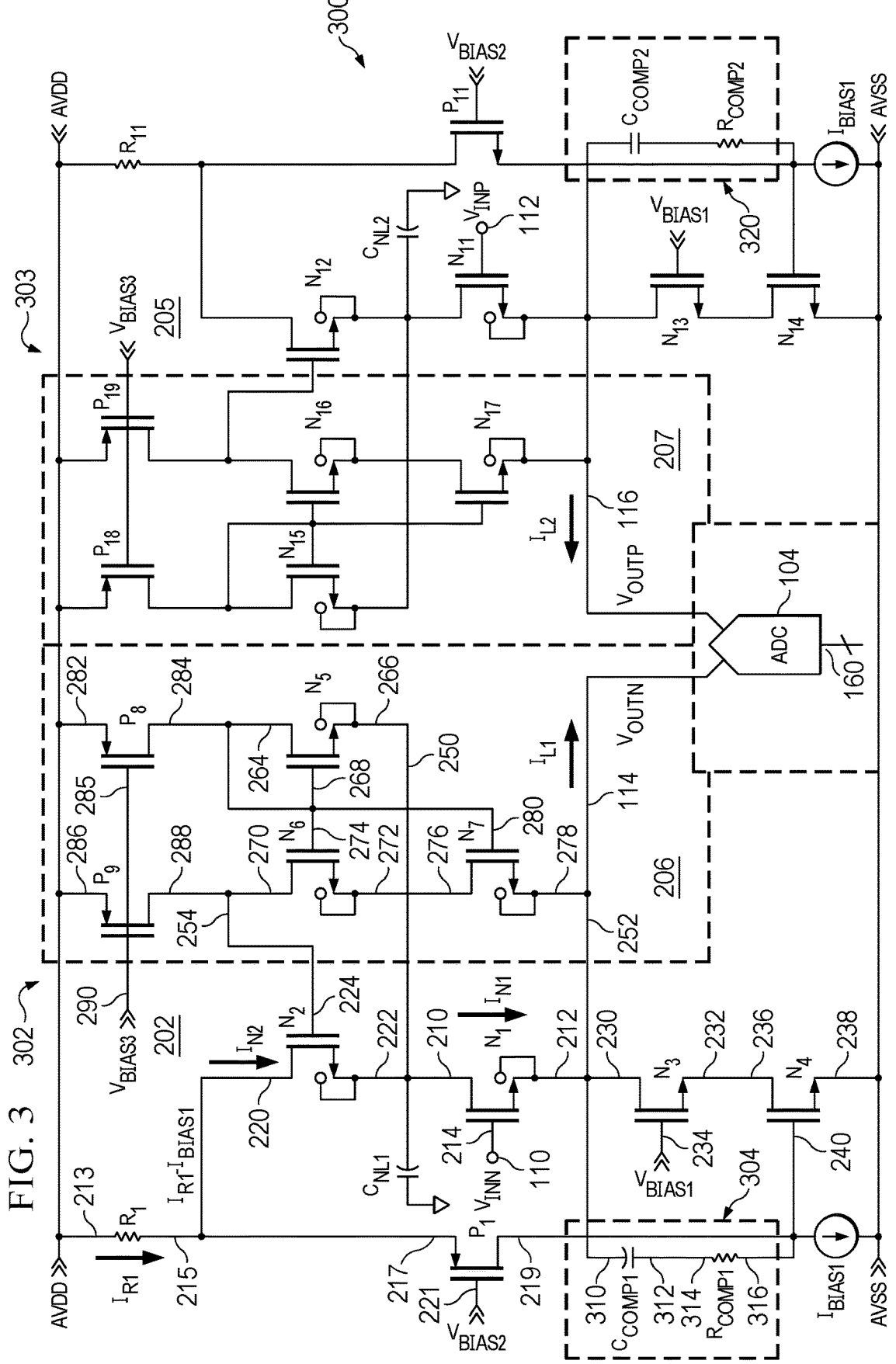
FIG. 3 illustrates a schematic diagram of a driver of an example embodiment that includes a compensation circuit.

FIG. 3 illustrates a schematic diagram of a driver 300 of an example embodiment. Portions of the driver 300 are the same as the driver 200. As such, these similar features share the same reference numbers in FIGS. 2 and 3. The driver 300 includes an inverting amplifier stage 302 which is similar to the inverting amplifier stage 202 (shown in FIG. 2) except that a compensation circuit 304 and a non-linear capacitor $C_{NL1}$ are added to the inverting amplifier stage 302, but the capacitor $C_2$ and the resistor $R_2$ are not present in the inverting amplifier stage 302. The compensation circuit 304 is coupled between the second terminal 212 of $N_1$ and the control terminal 240 of $N_4$, and the non-linear capacitor $C_{NL1}$ is coupled between the first terminal 210 of the transistor $N_1$ and the common potential AVSS. The driver 300 includes a non-inverting amplifier stage 303 which is configured similarly to the inverting amplifier stage 302.

In some example embodiments, the compensation circuit 304 includes a compensation capacitor $C_{COMP1}$ (e.g., around 7 pF to around 20 pF) which includes a first terminal 310 coupled to the second terminal 212 of the first transistor $N_1$ and includes a second terminal 312. The compensation circuit 304 includes a compensation resistor $R_{COMP1}$ (e.g., around 20 ohms to around 70 ohms) which includes a first terminal 314 coupled to the second terminal 312 of the compensation capacitor $C_{COMP1}$ and a second terminal 316 coupled to the control terminal 240 of the fourth transistor $N_4$. The non-inverting amplifier stage 303 includes a compensation circuit 320 which includes a compensation capacitor $C_{COMP2}$ (e.g., around 7 pF to around 20 pF) and a resistor $R_{COMP2}$ (e.g., around 20 ohms to around 70 ohms). The compensation circuit 320 is configured in the same way as the compensation circuit 304.

During a sampling phase of the ADC 104, the inverting output 114 is coupled to the capacitor $C_{SN}$ (shown in FIG. 1) which is charged or discharged. Because the ADC 104 may operate at a high frequency (e.g., around 5 MHz or greater), the driver 100 is required to charge or discharge the capacitor $C_{SN}$ rapidly. As a result, a load current $I_{L1}$ which flows into and out of $C_{SN}$, has a linear and a non-linear characteristic at high frequency. However, the current $I_{N1}$ through the transistor $N_1$ remains constant because both $I_{R1}$ and $I_{BIAS1}$ are constant. The compensation circuit 304 provides an additional path to rapidly charge or discharge the capacitor $C_{SN}$ during the sampling phase. During the sampling phase any disturbances or glitches at the source 212 of $N_1$ is coupled to the gate 240 of $N_4$ through the compensation capacitor $C_{COMP1}$, thus providing a path from $N_1$ to $N_4$, thereby allowing faster charging and discharging of the capacitor $C_{SN}$ (shown in FIG. 1). At a high frequency, the compensation capacitor $C_{COMP1}$ acts as a short circuit (e.g., $C_{COMP1}$ has a very low impedance). When the capacitor $C_{SN}$ is connected to $V_{OUTN}$, $V_{OUTN}$ may rise instantaneously resulting in a positive glitch. The compensation circuit 304 couples the positive glitch to the control terminal 240 of the transistor $N_4$, thereby strongly turning on $N_4$ to draw a higher current to discharge the capacitor $C_{SN}$ and settle the positive glitch rapidly. Conversely, if $V_{OUTP}$ drops instantaneously resulting in a negative glitch, the compensation circuit 304 couples the negative glitch to the control terminal 240 of the transistor $N_4$, thereby turning off $N_4$. As a result, the current $I_{N1}$ flows into the ADC 104 to charge the capacitor $C_{SN}$ and to settle the negative glitch. In some example embodiments, by adding the compensation circuit 304, a settling time of the ADC 104 is reduced by approximately 2.8 nano seconds.

The capacitor $C_{COMP1}$ draws a current (also referred to as a frequency dependent current) which flows from $V_{OUTN}$ through $N_1$, $N_2$, $P_1$, $R_{COMP1}$, $C_{COMP1}$ and to $V_{OUTN}$. This frequency dependent current modulates the transconductance (gm) of the transistor $N_1$, resulting in a second harmonic voltage $V_{HD2}$ (not shown in FIG. 3) at the source 212 of $N_1$, which may cause distortion of $V_{OUTN}$. The second harmonic voltage $V_{HD2}$ has a frequency twice the fundamental frequency (e.g., frequency of $V_{INN}$). The second harmonic voltage $V_{HD2}$ is amplified by $N_1$ and is thus present at the drain 212 of $N_1$ and the source 222 of $N_2$.

In some example embodiments, the non-linear capacitor $C_{NL1}$ is implemented using a reverse-biased diode (not shown in FIG. 3). The capacitance of $C_{NL1}$ (e.g., around 1.5 pF to around 2.5 pF) changes non-linearly depending on the voltage across $C_{NL1}$. The non-linear capacitor $C_{NL1}$ produces a third harmonic current $I_{HD3}$ (not shown in FIG. 3) due to a mixing of the second harmonic voltage $V_{HD2}$ with a linear coefficient of $C_{NL1}$. The third harmonic current $I_{HD3}$ flows through the transistor $N_1$ and produces a third harmonic voltage $V_{HD3}$ (not shown in FIG. 3). The third harmonic voltage $V_{HD3}$ is equal to $I_{HD3}$/gm, where gm is the input transconductance of $N_1$ and $I_{HD3}$ (not shown in FIG. 3) is a third harmonic current. The non-inverting amplifier stage 303 operates in a same way as the inverting amplifier stage 302, and the description related to the configuration and operation of the inverting stage 302 is also applicable to the non-inverting stage 303. In a differential implementation, since the output is differential (e.g., $V_{OUTP}$–$V_{OUTN}$) $V_{HD2}$ components are cancelled because they are in-phase with respect to each other and equal in magnitude, and only $V_{HD3}$ components remain because they are out of phase with respect to each other.

Figure 4:
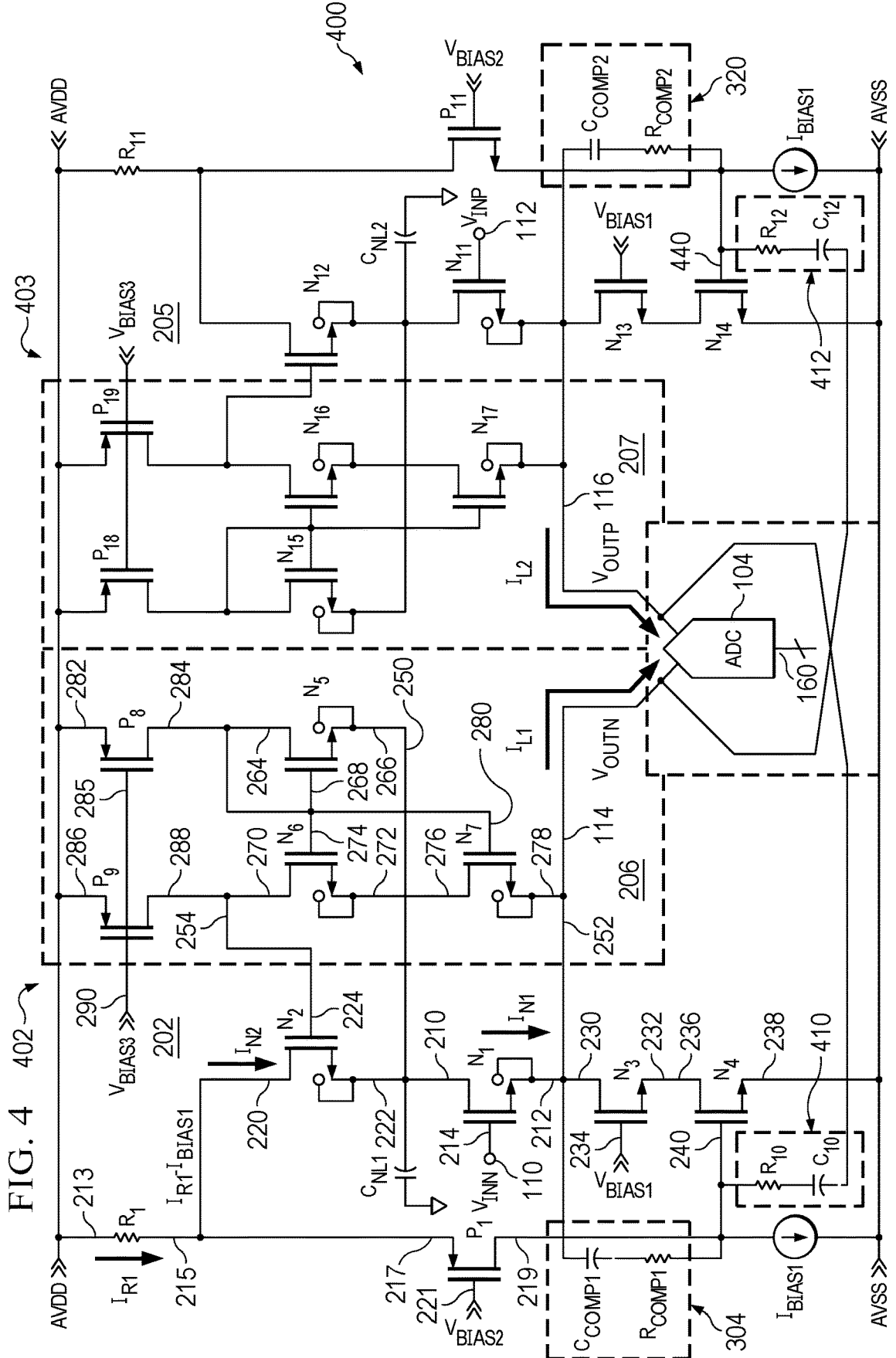
FIG. 4 illustrates a schematic diagram of a driver of an example embodiment that includes a cross-capacitor compensation circuit.

FIG. 4 illustrates a schematic diagram of a driver 400 of an example embodiment. Driver 400 includes features that are similar to driver 200 and/or driver 300. Such similar features are designated with the same reference numbers or other reference designators. The driver 400 includes an inverting amplifier stage 402 and a non-inverting amplifier stage 403. The inverting amplifier stage 402 is configured in a similar way to the inverting amplifier stage 302 (shown in FIG. 3) except that a first cross-capacitor compensation circuit 410 is coupled between the first compensation circuit 304 (e.g., coupled to the control terminal 240 of the transistor $N_4$) and the output 116 of the non-inverting amplifier stage 403. The non-inverting amplifier stage 403 is configured in a similar way as the inverting amplifier stage 402. A second cross-capacitor compensation circuit 412 is coupled between the second compensation circuit 320 (e.g., coupled to the control terminal 440 of a transistor $N_{14}$) and the output 114 of the inverting amplifier stage 402.

In some example embodiments, the first cross-capacitor compensation circuit 410 includes a resistor $R_{10}$ (also referred to as a first cross-resistor) (e.g., around 35 ohms to around 70 ohms) and a capacitor $C_{10}$ (also referred to as a first cross-capacitor) (e.g., around 7 pF to around 10 pF) coupled in series between the control terminal 240 of the transistor $N_4$ and the output 116 of the non-inverting amplifier stage 403. The second cross-capacitor compensation circuit 412 includes a resistor $R_{12}$ (also referred to as a second cross-resistor) (e.g., around 35 ohms to around 70 ohms) and a capacitor $C_{12}$ (also referred to as a second cross-capacitor) (e.g., around 7 picofarads to around 10 picofarads) coupled in series between the control terminal 440 of the transistor $N_{14}$ and the output 114 of the inverting amplifier stage 402. In some example embodiments, $C_{10}$ has a same capacitance value as $C_{COMP1}$ and $R_{10}$ has a same resistance value as $R_{COMP1}$. Due to the presence of the cross-capacitor compensation circuit 410, the frequency dependent current due to $C_{COMP1}$ does not flow through the transistor $N_1$ but instead flows through a path comprising $N_4$, $N_3$, $V_{OUTP}$, $C_{COMP1}$, $R_{COMP1}$, $R_{10}$, $C_{10}$, $N_{13}$, $N_{14}$ and the common potential AVSS. As such, modulation of the transconductance (gm) of $N_1$ is minimized, which results in an improvement of a distortion due to the improvement of second harmonic $V_{HD2}$. The second cross-capacitor compensation circuit 412 operates in a similar way as the first cross-capacitor compensation circuit 410. In some example embodiments, by implementing the cross-capacitor compensation circuits, 410 and 412, a distortion due to the second harmonic $V_{HD2}$ is reduced from –67 dB to –79 dB at around 5 MHz.

In some example embodiments, because the load current $I_{L1}$ and a frequency dependent current due to $C_{COMP1}$ and $C_{12}$ flow through the transistor $N_4$, a non-linear voltage swing occurs at the gate 240 of the transistor $N_4$ due to a non-linear transconductance of $N_4$. The non-linear voltage swing at the gate 240 of $N_4$ generates the third harmonic current $I_{HD3}$ which flows from the gate 240 of $N_4$ through a path comprising $P_1$, $N_2$ and $N_1$. The third harmonic current $I_{HD3}$ has a frequency three times greater than the fundamental frequency (e.g., frequency of $V_{INN}$ and $V_{INP}$). Due to the second harmonic voltage $V_{HD2}$ present at the source 222 of $N_2$, the capacitor $C_{NL1}$ produces an additional third harmonic current (referred to as Delta*$I_{HD3}$) (not shown in FIG. 4) which is phase-shifted by 180 degrees with respect to $I_{HD3}$. The additional third harmonic current Delta*$I_{HD3}$ suppresses the third harmonic current $I_{HD3}$ (e.g., partially cancels each other or completely cancels each other if Delta is equal to 1), thus reducing distortion at the output 114.

In some example embodiments, a conduction path for the high frequency current (e.g., around 1 MHz to around 5 MHz) includes the transistors $N_3$, $N_4$, the first cross-compensation circuit 410, the transistors $N_{13}$, $N_{14}$, and the cross-compensation circuit 412. The second cross-capacitor compensation circuit 412 is coupled to the common potential AVSS via the transistors $N_3$ and $N_4$, and the first cross-capacitor compensation circuit 410 is coupled to the common potential AVSS via the transistors $N_{14}$ and $N_{13}$. At a high frequency, the capacitors $C_{10}$ and $C_{12}$, $C_{COMP1}$ and $C_{COMP2}$ act as short circuits (e.g., they have very low impedances). Thus, at a high frequency, the conduction path formed by the cross-capacitor compensation circuits 410 and 412 and $C_{COMP1}$ and $C_{COMP2}$ allow high frequency currents to circulate without flowing through the transistors $N_1$ and $N_{11}$. In some example embodiments, by implementing the cross-capacitor compensation circuits 410 and 412 and the non-linear capacitors $C_{NL1}$ and $C_{NL2}$, the total harmonic distortion is reduced to approximately −109 dB at around 1 MHz and to approximately −96.1 dB at around 5 MHz.

The circuits described herein may include one or more semiconductor elements (such as transistors), one or more passive elements (such as resistors, capacitors and/or inductors), and/or one or more sources (such as voltage and/or current sources). The circuits may include only semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party. While some example embodiments may include certain elements implemented in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

In this description, the term "couple" may cover connections, communications, or signal paths that enable a functional relationship consistent with this description. For example, if device A provides a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal provided by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronic or semiconductor component.

While some example embodiments suggest that certain elements are included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

While the use of particular transistors are described herein, other transistors (or equivalent devices) may be used instead with little or no change to the remaining circuitry. For example, a metal-oxide-silicon FET (MOSFET) (e.g., an n-channel MOSFET or a p-channel MOSFET), a bipolar junction transistor (BJT) (e.g., NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While certain components may be described herein as being of a particular process technology, these components may be exchanged for components of other process technologies. Circuits described herein are reconfigurable to include the replaced components to provide functionality at least partially similar to functionality available before the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between the same two nodes as the single resistor or capacitor. Also, uses of the phrase "ground terminal" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means+/−10 percent of the stated value, or, if the value is zero, a reasonable range of values around zero. Modifications are possible in the described examples, and other examples are possible within the scope of the claims.

What is claimed is:

1. A driver comprising:
a driver input;
a driver output;
a voltage follower comprising:
   a first transistor including a first terminal, a second terminal coupled to the driver output, and a control terminal coupled to the driver input;
   a second transistor including a third terminal adapted to be coupled to a first potential, a fourth terminal coupled to the first terminal, and a control terminal;
   a third transistor including a fifth terminal coupled to the second terminal, a sixth terminal, and a control terminal adapted to be coupled to a first bias voltage source; and
   a fourth transistor including a seventh terminal coupled to the sixth terminal, an eighth terminal adapted to be coupled to a common potential, and a control terminal coupled to the third terminal; and
a gain-boost amplifier including a first input coupled to the first terminal, a second input coupled to the second terminal, and an output coupled to the control terminal of the second transistor.

2. The driver of claim 1, wherein the voltage follower comprises:
a first resistor including a ninth terminal adapted to be coupled to the first potential and a tenth terminal coupled to the third terminal; and
a biasing transistor including an eleventh terminal coupled to the tenth terminal, a twelfth terminal coupled to the control terminal of the fourth transistor, and a control terminal adapted to be coupled to a second bias voltage source.

3. The driver of claim 1, wherein the voltage follower comprises a first bias current source adapted to be coupled between the control terminal of the fourth transistor and the common potential.

4. The driver of claim 1, wherein the gain-boost amplifier comprises:
a fifth transistor including a fifteenth terminal, a sixteenth terminal coupled to the first terminal, and a control terminal coupled to the fifteenth terminal;
a sixth transistor including a seventeenth terminal coupled to the control terminal of the second transistor, an eighteenth terminal, and a control terminal coupled to the control terminal of the fifth transistor;
a seventh transistor including a nineteenth terminal coupled to the eighteenth terminal, a twentieth terminal coupled to the second terminal, and a control terminal coupled to the control terminals of the fifth and sixth transistors;
an eighth transistor including a twenty-first terminal adapted to be coupled to the first potential, a twenty-second terminal coupled to the eighteenth terminal, and a control terminal adapted to be coupled to a third bias voltage source; and
a ninth transistor including a twenty-third terminal adapted to be coupled to the first potential, a twenty-fourth terminal coupled to the sixteenth terminal, and a control terminal adapted to be coupled to the third bias voltage source.

5. The driver of claim 1, wherein the voltage follower comprises a compensation circuit coupled between the control terminal of the fourth transistor and the second terminal.

6. The driver of claim 5, wherein the compensation circuit comprises a compensation capacitor and a compensation resistor coupled in series between the control terminal of the fourth transistor and the second terminal.

7. The driver of claim 1, wherein the voltage follower further comprises a non-linear capacitor adapted to be coupled between the first terminal and the common potential.

8. A driver comprising:
a driver input;
a driver output;
a voltage follower comprising:
   a first transistor including a drain, a source coupled to the driver output, and a gate coupled to the driver input;
   a second transistor including a drain adapted to be coupled to a first potential, a source coupled to the drain of the first transistor, and a gate;
   a third transistor including a drain coupled to the source of the first transistor, a source, and a gate adapted to be coupled to a first bias voltage source; and
   a fourth transistor including a drain coupled to the source of the third transistor, a source adapted to be coupled to a common potential, and a gate coupled to the drain of the second transistor; and
a gain-boost amplifier including a first input coupled to the drain of the first transistor, second input coupled to the source of the first transistor, and an output coupled to the gate of the second transistor.

9. The driver of claim 8, wherein the voltage follower comprises:
a first resistor adapted to be coupled between the first potential and the drain of the second transistor; and
a biasing transistor including a source coupled to the first resistor, a drain coupled to the gate of the fourth transistor, and a gate adapted to be coupled to a second bias voltage source.

10. The driver of claim 8, wherein the voltage follower comprises a first bias current source adapted to be coupled between the gate of the fourth transistor and the common potential.

11. The driver of claim 8, wherein the voltage follower comprises a compensation circuit coupled between the gate of the fourth transistor and the source of the first transistor.

12. The driver of claim 11, wherein the compensation circuit comprises a compensation capacitor coupled in series with a compensation resistor between gate of the fourth transistor and the source of the first transistor.

13. The driver of claim 8, wherein the voltage follower comprises a non-linear capacitor adapted to be coupled between the drain of the first transistor and the common potential.

14. A driver comprising:
an inverting amplifier stage comprising:
   an inverting amplifier input;
   an inverting amplifier output;
   a first voltage follower including a first input coupled to the inverting amplifier input and a first output coupled to the inverting amplifier output; and
   a first gain-boost amplifier coupled to the first voltage follower;

a non-inverting amplifier stage comprising:

a non-inverting amplifier input;

a non-inverting amplifier output;

a second voltage follower including a second input coupled to the non-inverting amplifier input and a second output coupled to the non-inverting amplifier output; and a second gain-boost amplifier coupled to the second voltage follower; and a first compensation circuit comprising a first capacitor and a first resistor coupled in series, and coupled between the non-inverting amplifier output and the first voltage follower.

15. The driver of claim 14, further comprising a first non-linear capacitor coupled between the first voltage follower and a common potential terminal.

16. The driver of claim 15, further comprising a second non-linear capacitor coupled between the second voltage follower and the common potential terminal.

17. The driver of claim 14, further comprising a second compensation circuit coupled between the inverting amplifier output and the second voltage follower.

18. The driver of claim 17, wherein the second compensation circuit comprises a second capacitor and a second resistor coupled in series between the inverting amplifier output and the second voltage follower.

19. The driver of claim 14, wherein the first voltage follower comprises:

a first transistor including a first terminal, a second terminal coupled to the inverting amplifier output, and a control terminal coupled to the inverting amplifier input;

a second transistor including a third terminal, a fourth terminal coupled to the first terminal, and a control terminal;

a third transistor including a fifth terminal coupled to the second terminal, a sixth terminal, and a control terminal; and a fourth transistor including a seventh terminal coupled to the sixth terminal, an eighth terminal, and a control terminal coupled to the third terminal.

20. The driver of claim 19, wherein the first gain-boost amplifier includes a first input coupled to the first terminal, a second input coupled to the second terminal, and an output coupled to the control terminal of the second transistor.

21. The driver of claim 19, wherein the first compensation circuit is coupled between the non-inverting amplifier output and the control terminal of the fourth transistor.

22. An electronic circuit comprising:

A driver comprising:

an inverting amplifier stage comprising:

an inverting amplifier input;

an inverting amplifier output;

a first voltage follower including a first input coupled to the inverting amplifier input and a first output coupled to the inverting amplifier output; and a first gain-boost amplifier coupled to the first voltage follower;

a non-inverting amplifier stage comprising:

a non-inverting amplifier input;

a non-inverting amplifier output;

a second voltage follower including a second input coupled to the non-inverting amplifier input and a second output coupled to the non-inverting amplifier output; and a second gain-boost amplifier coupled to the second voltage follower; and an analog to digital converter (ADC) having first and second inputs respectively coupled to the inverting amplifier output and the non-inverting amplifier output.

23. The electronic circuit of claim 22, wherein the driver comprises:

a first compensation circuit comprising a first capacitor and a first resistor coupled in series, and coupled between the non-inverting amplifier output and the first voltage follower; and a second compensation circuit comprising a second capacitor and a second resistor coupled in series, and coupled between the inverting amplifier output and the second voltage follower.

24. The electronic circuit of claim 22, wherein the first voltage follower comprises:

a first transistor including a first terminal, a second terminal coupled to the inverting amplifier output, and a control terminal coupled to the inverting amplifier input;

a second transistor including a third terminal, a fourth terminal coupled to the first terminal, and a control terminal;

a third transistor including a fifth terminal coupled to the second terminal, a sixth terminal, and a control terminal; and a fourth transistor including a seventh terminal coupled to the sixth terminal, an eighth terminal, and a control terminal coupled to the third terminal.

* * * * *